United States Patent
Stansell et al.

(10) Patent No.: US 7,598,794 B1
(45) Date of Patent: Oct. 6, 2009

(54) WELL BIAS ARCHITECTURE FOR INTEGRATED CIRCUIT DEVICE

(75) Inventors: Galen E. Stansell, Kirkland, WA (US); King Eric Kwan, Bellevue, WA (US); Xiaolin Ouyang, Seattle, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 185 days.

(21) Appl. No.: 11/904,246

(22) Filed: Sep. 25, 2007

Related U.S. Application Data

(60) Provisional application No. 60/848,288, filed on Sep. 28, 2006.

(51) Int. Cl.
*H03K 3/01* (2006.01)

(52) U.S. Cl. .................................. 327/534; 327/434
(58) Field of Classification Search .................. None
See application file for complete search history.

(56) References Cited

U.S. PATENT DOCUMENTS

| | | | |
|---|---|---|---|
| 5,371,419 A * | 12/1994 | Sundby | 327/543 |
| 6,924,690 B2 * | 8/2005 | Nakamura | 327/365 |
| 7,385,433 B2 * | 6/2008 | Callahan, Jr. | 327/534 |
| 2005/0007827 A1 * | 1/2005 | Seki | 365/189.05 |

* cited by examiner

*Primary Examiner*—Cassandra Cox

(57) ABSTRACT

Disclosed is a high voltage switch circuit that can include a first well bias switch configured to track the greater of an input voltage and a supply voltage, a voltage comparator configurable to compare the input voltage to a predetermined reference voltage, and a second well bias switch having a control input coupled to an output of the comparator.

20 Claims, 6 Drawing Sheets f(VREF) > VDDIO >= GPIO f(VREF) > GPIO > VDDIO

GPIO > f(VREF) > VDDIO

VREF > VDDIO >= GPIO

WELL BIAS ARCHITECTURE FOR INTEGRATED CIRCUIT DEVICE

This application claims the benefit of U.S. provisional patent application Ser. No. 60/848,288, filed Sep. 28, 2006, the contents of which are incorporated by reference herein.

TECHNICAL FIELD

The present invention relates generally to electronic circuits and in particular to circuits for high voltage switches, such as well biasing circuits.

BACKGROUND OF THE INVENTION

Semiconductor integrated circuit devices typically include a bulk region doped to a first conductivity type (e.g., p-type) that includes "wells" doped to another conductivity type (e.g., n-type). For integrated circuits composed only of logic circuits, such wells can be maintained at essentially a same bias potential. For example, a p-type "bulk" region can be maintained at a low power supply voltage VSS (which is typically ground), while n-wells formed within the bulk can be maintained at a high power supply voltage VDD.

However, for integrated circuits including other types of functions, additional power supply voltages can be received, or a power supply level can vary according to operation. As but one example, integrated circuits containing nonvolatile programmable elements can receive input voltages higher than (or lower than) a normal supply voltage range. Such high voltages can be used for programming and/or erasing such programmable elements. Such circuits can include well bias generator circuits.

One purpose of a well bias generator circuit can be to ensure that the source/bulk connection of p-type field effect transistors (PFETs) in the programming circuitry or in a non-volatile core are not forwarded biased. In some conventional arrangements, well bias generators can include a switch connected a pin of the integrated circuit, because such a pin is "shared", as it is used as a "normal input" in non-programming operations, or as programming pin in programming operations. This can help reduce a pin count on a device and to allow such a device to be in-package programmable. Since, during non-programming operations, normal inputs can be at a standard power supply voltage, the switch ensures that in a programming operation, the wells are at the highest possible voltage (an applied programming voltage).

To better understand various aspects of the disclosed embodiments, two conventional high voltage switching arrangements will now be described.

A first type of conventional high voltage switch arrangement can use a single well bias switch that follows the higher of a programming voltage input (GPIO) and an input/output power supply voltage (VDDIO). An example of such a conventional approach is shown in FIGS. 8A to 8C, and designated by the general reference character 800. Conventional arrangement 800 is typically used in integrated circuit devices in which the I/O power supply (VDDIO) is physically tied to a core supply (VDDCORE).

A conventional arrangement 800 can include I/O circuitry 802, core circuitry 804, and a well switching circuit 806. I/O circuitry 802 can be considered to have "split" I/O well arrangement, as it can include PFETs having two different well biasing schemes. A first type of PFET (one shown as PIOHV) can receive a supply voltage VDDIO and can be formed in a well biased to the same supply voltage VDDIO. A second type PFET (one shown as PIOLV) can receive another supply voltage VDDCORE, and have a well biased to a bias voltage VWB, where VWB varies according to operation.

Core circuitry 804 can include PFETs biased in the same fashion as transistors PIOLV within I/O circuitry 802.

A well switching circuit 806 can include a PFET structure P80, a first resistance R80 and a second resistance R82. PFET structure P80 can have a source connected to receive voltage GPIO and a drain and body connected to provide bias voltage VWB. A gate of PFET structure P80 can be connected to supply voltage VDDCORE by resistance R80, and to its drain/body by resistance R82.

FIG. 8A shows the operation of conventional switch arrangement 800 under conditions in which GPIO <=VDDCORE, and VDDIO=VDDCORE. Such conditions can occur during "normal" operations. As shown in the figure, if GPIO <=VDDCORE, a source-gate voltage (across resistance R80) is not sufficient to turn on PFET structure P80, consequently, a well bias voltage VWB follows VDDCORE via resistances R80/R82, and as shown by the bold line path.

FIG. 8B shows the operation of conventional switch arrangement 800 under conditions in which GPIO>VDDCORE. Such conditions can occur during "split voltage" operations. Under these conditions, a voltage GPIO is sufficiently large enough to turn on PFET structure P80 (place it into a low impedance state), which can cause well bias voltage VWB to follow GPIO. This biasing path is also shown by a bold line. It is noted that in such an arrangement, well bias voltage VWB can be greater than VDDCORE. Consequently, PFETs in core circuitry 804 and those biased like PIOLV, can have increased threshold voltages (Vts) (as compared to when their respective wells are biased to VDDCORE).

FIG. 8C shows the operation of a conventional switch arrangement 800 under conditions in which GPIO>>VDDCORE. In particular, GPIO is sufficiently large enough that a leakage current (shown as l(leak)) can be created between GPIO and VDDCORE.

A conventional arrangement like that of FIGS. 8A to 8C can have disadvantageously large leakage current, and can require that the various different power supply levels be applied only in a certain order (supply sequencing). This can add to the complexity of any design incorporating such conventional devices. In addition, such approaches impose limits on supply voltage ranges ("headroom"), as increases in the Vts of PFETs resulting from variations in well bias levels have to be accounted for.

Another conventional high voltage switch design architecture is shown in FIGS. 9A and 9B and designated by the general reference character 900. A conventional arrangement 900 can include similar structures to those of FIGS. 8A to 8C, but differs in that I/O circuitry 902 does not include a split well arrangement, having PFETs formed in wells biased to VWB. Within core circuitry 904, PFETs share the same well biasing as I/O circuitry 902, but can receive a lower power supply voltage VDDCORE (which is less than VDDIO). Arrangement 900 further differs from that of FIGS. 8A to 8C, in that a PFET structure P90 can have a gate connected to an I/O supply voltage VDDIO by a resistance R90, and to its drain/body by resistance R92.

FIGS. 9A and 9B show an arrangement in which a well bias switch can follow the higher of an input voltage GPIO or an I/O power supply voltage VDDIO.

FIG. 9A shows the operation of conventional switch arrangement 900 under conditions in which GPIO<=VDDIO. Such conditions can occur during "normal" operations. As shown in the figure, if GPIO <=VDDIO, a source-gate voltage (across resistance R90) is not sufficient to turn on PFET structure P90. Consequently, a well bias voltage VWB follows VDDIO via resistances R90/R92 (shown by the bold line path).

FIG. 9B shows the operation of a conventional switch arrangement 900 under conditions in which GPIO>VDDIO. Under these conditions, a voltage GPIO is sufficiently large enough to turn on PFET structure P90, which can provide a low impedance source-drain path and cause VWB to follow GPIO. This biasing path is also shown by a bold line. As in the case of FIGS. 8A to 8C, such an increase in well bias for devices in core circuitry can result in greater Vts and the resulting drawbacks.

A disadvantage of the second conventional solution of FIGS. 9A and 9B can be that similar problems exist to those of the first conventional solution of FIGS. 8A to 8C, including loss of headroom, the need for supply sequencing, etc.

It is noted that in conventional cases shown above, voltages VDDCORE and VDDIO core are not always maintained at one level, and can be switched during programming to the programming voltage level (often referred to as VPP). Further, during normal operation these voltages may be at levels other than the local supply level.

Disadvantages of the first conventional solution of FIGS. 8A to 8C can include that a well bias voltage VWB follows the higher of VDDIO and GPIO. On devices with a separate core supply or a regulated core, the core supply voltage can be significantly lower than the I/O supply voltage, or it can ramp at a later time than the I/O supply voltage. As noted above, this can result in a negative source/bulk potential on PFETs in core circuitry. A negative source/bulk potential can raise the Vts of these PFETs. This is an undesirable result since headroom can be lost on sensitive circuits. As but one example, conventional circuits can include power-on-reset (POR) circuits for detecting a power on or reset condition. Such circuits can be based on a "native" Vt of a FET device. As a result, in a conventional arrangement, a POR circuit of a device can trip prior to having enough supply voltage to sufficiently turn on PFETs having changed Vts due to higher well bias levels. This can makes operations like loading non-volatile memories on POR events dependent on the trip voltage supply level or impose a power supply sequencing order.

In addition, as noted above, in a conventional case like that of FIGS. 8A to 8C, a leakage path can exists from the GPIO input to the well especially if a GPIO voltage is sufficiently higher then VDDCORE. This situation can occur, as but one example, for a device having a 3.3V I/O supply (VDDIO) and a 1.8V core supply (VDDCORE) with GPIO at 3.3V. Furthermore, under such conditions, the source/bulk potential of the core devices are now dependent on the GPIO level.

DETAILED DESCRIPTION

Various embodiments of the present invention will now be described in detail with reference to a number of drawings. The embodiments show methods and devices that can automatically provide well biasing voltages to two or more different wells. The embodiments can allow high voltage circuits to interface with low voltage circuits.

In particular embodiments, a well biasing circuit can be utilized in conjunction with programming inputs for programming non-volatile circuit elements. The embodiments can allow for robust and safe well biasing at an input/output (I/O) high voltage switch circuit, while maintaining very low input leakage during normal operation, and essentially no back bias on transistors in low voltage region during normal operation. Particular embodiments can also allow a programming input to be placed on a general purpose input while maintaining tight input leakage specifications.

Still further, embodiments can allow core operations, such as the loading of data from non-volatile memories, to be performed at relatively low voltages (such as near a power-on-reset trip voltage) regardless of the state of a programming input.

Figure 8A:
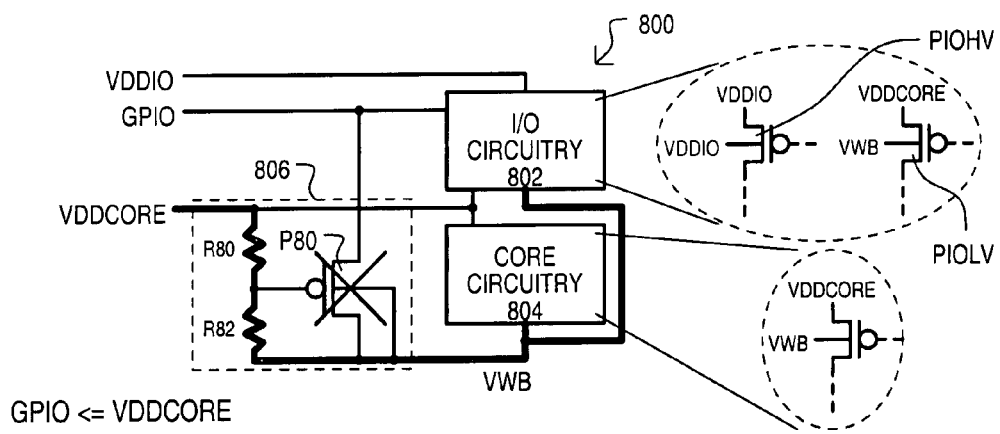
FIGS. 8A to 8C show a first conventional well switching arrangement.
Figure 8B:
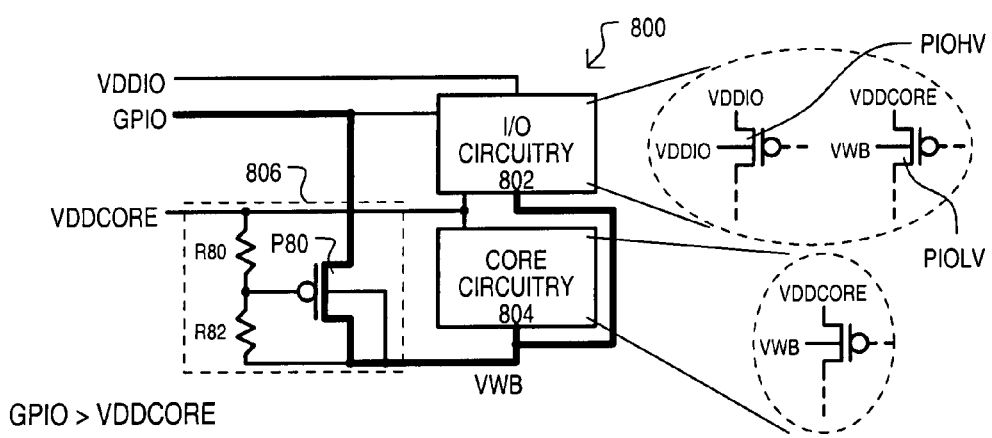
Figure 8C:
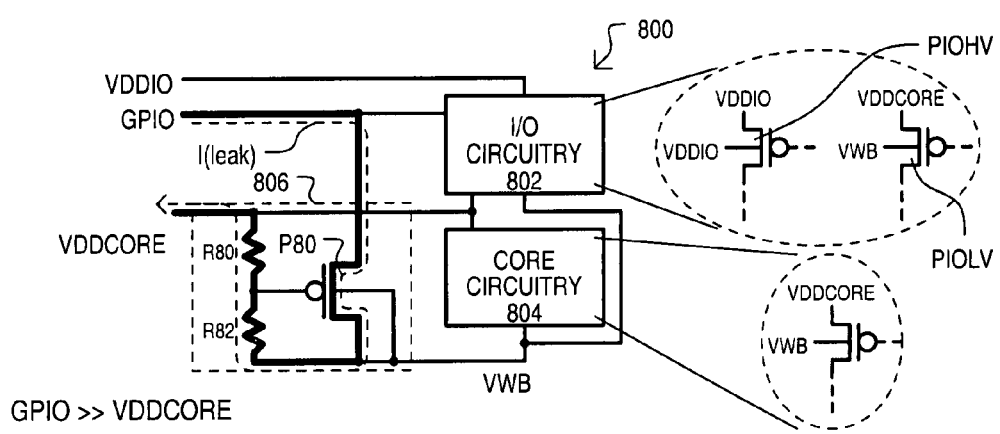
Figure 9A:
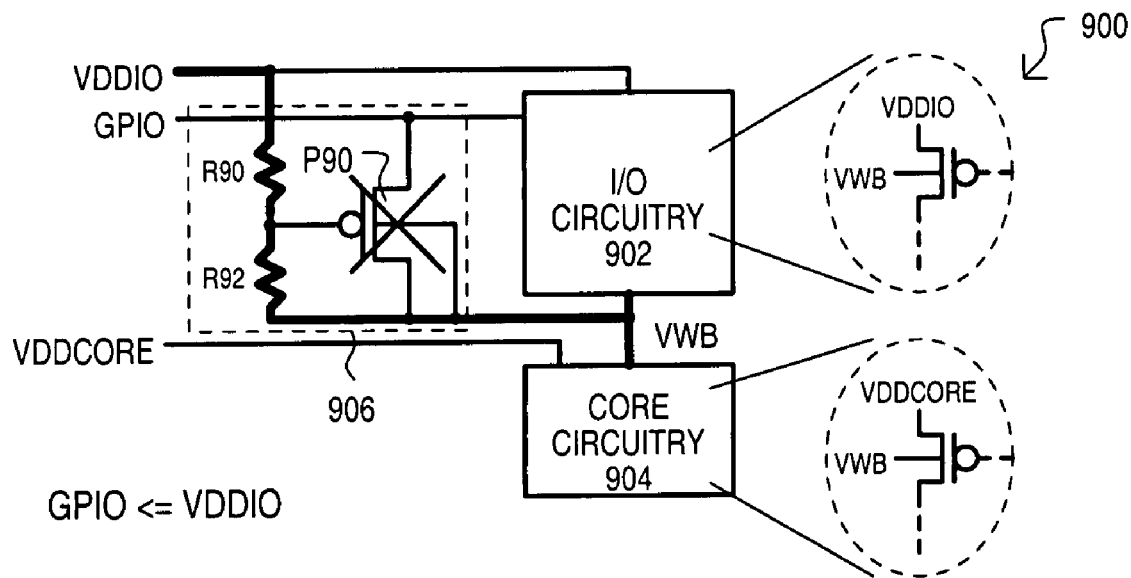
FIGS. 9A and 9B show a second conventional well switching arrangement.
Figure 9B:
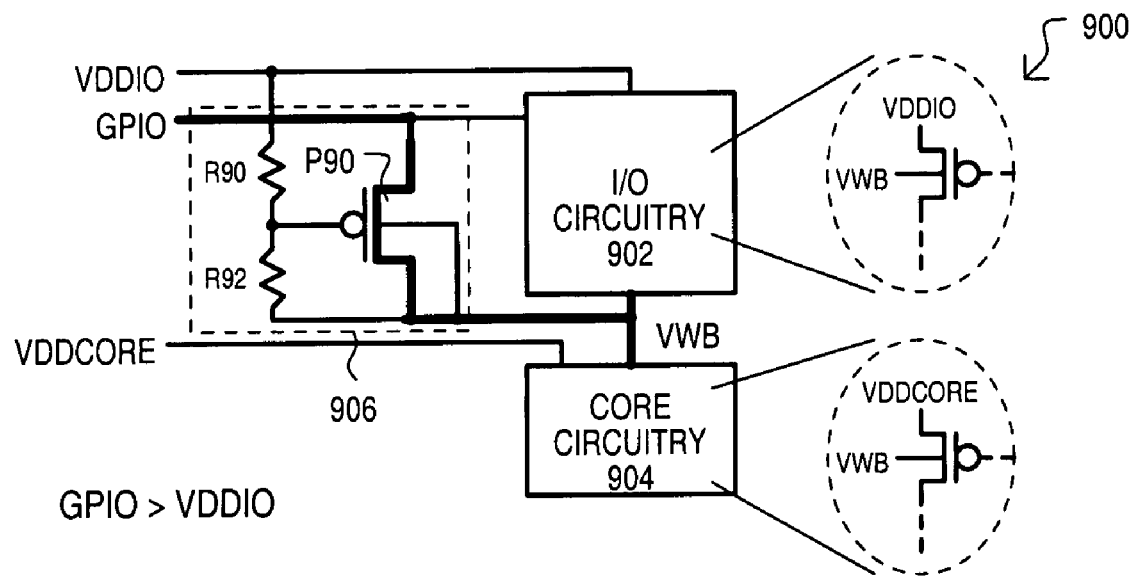

Embodiments of the invention show a dual well bias scheme with automatic detection of an input voltage (GPIO), which can be a programming pulse in particular embodiments. The detection of such an input voltage can allow a core well bias to switch to a higher potential only when necessary. Thus, absent such a necessity, a core well bias voltage can remain at a lower core power supply voltage (VDDCORE). This can eliminate the need for supply sequencing and headroom limitations that can occur in conventional arrangements. Further, such approaches can eliminate leakage paths on a voltage input that can occur in conventional arrangements, like that shown in FIG. 8C.

It is noted that in the disclosed embodiments, supply voltages VDDCORE and VDDIO need not be static voltages for all operations of an integrated circuit. Such voltages can vary according to mode of operation. As but one example, such voltages could be switched to a programming voltage (VPP) during programming operations in the case of nonvolatile applications.

Figure 1:
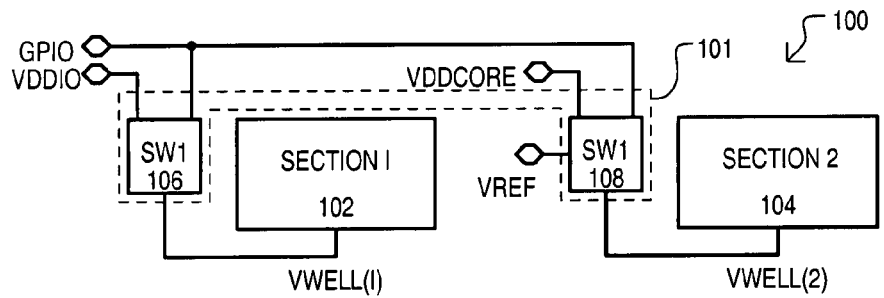
FIG. 1 is a block schematic diagram of a first embodiment of the present invention.

Referring now to FIG. 1, a well bias architecture according to a first embodiment is shown in a block schematic diagram and designated by the general reference character 100. Architecture 100 can include a switch section 101, a first section 102, and a second section 104. A first section 102 can include one or more semiconductor wells commonly connected to a first well bias voltage VWELL(1). Such wells can be semiconductor regions of a first conductivity type formed within a larger region of a second conductivity type. As but one example, a first section can be n-type wells formed in a p-type semiconductor substrate. Alternatively, a first section can include p-type wells formed in a n-type substrate (where such an n-type substrate may or may not itself be a well in a p-type substrate).

A second section 104 can also include wells having the same conductivity arrangement as first section. However, second section can have wells commonly connected to a second well bias voltage VWELL(2).

A switch section 101 can include a first switch circuit 106 and a second switch circuit 108. A first switch circuit 106 can provide a first well bias voltage VWELL(1) to first section 102. In the arrangement of FIG. 1, a first switch circuit 102 can receive a first voltage input GPIO and a second voltage input VDDIO. In one very particular arrangement, a voltage GPIO can be received at a predetermined input of an integrated circuit device containing the first and second sections (102 and 104). In an even more particular embodiment, a voltage GPIO can be received at an input/output that can serve as logic signal input and/or output in one mode, or as a high voltage supply voltage in another mode. A voltage VDDIO can be a supply voltage, and in one very particular arrangement, such a voltage can be a high power supply voltage for an input/output section of an integrated circuit device.

It is noted that preferably, a first switch circuit 106 operates in response to the GPIO and VDDIO voltages only. That is, it automatically switches in response to these two particular voltages to provide different supply connections for well bias voltage VWELL(1).

A second switch circuit 108 can provide a second well bias voltage VWELL(2) to second section 104. In the arrangement of FIG. 1, a second switch circuit 102 can receive first voltage input GPIO, a third voltage input VDDCORE, and a reference voltage VREF. In one very particular arrangement, voltage VDDCORE can be a low level power supply voltage. In one very particular arrangement, such a voltage can be a power supply voltage for a core section of an integrated circuit device that can operate at a lower power supply voltage than an input/output section of the integrated circuit.

Like first switch circuit 106, a second switch circuit 108 preferably operates only in response to the GPIO, VDDCORE, and VREF voltages only. That is, second switch circuit 108 can automatically switch in response to particular these three particular voltages to provide different supply connections for well bias voltage VWELL(2).

Having described the general construction of the architecture 100 of FIG. 1, operations for such an architecture will now be described with reference to FIGS. 2A to 2C.

Figure 2A:
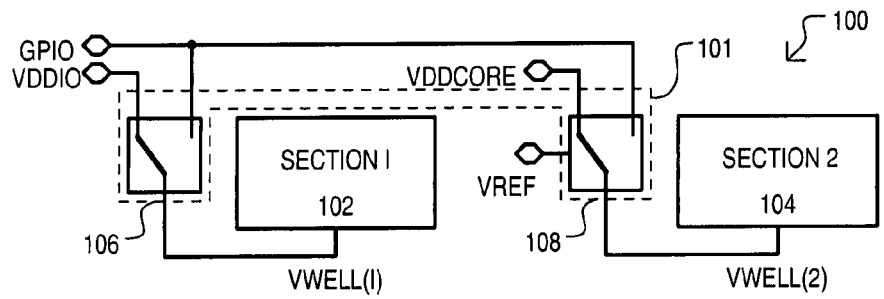
FIGS. 2A to 2C show various operations for the embodiment of FIG. 1.

Referring now to FIG. 2A, the operation of an architecture 100 for a first set of voltage conditions is shown. FIG. 2A shows operations of switch circuits (106 and 108) when f(VREF)>VDDIO >=GPIO. A value f(VREF) is understood to be a voltage that is a "function" of a reference VREF. In some arrangements, f(VREF) can be VREF itself, but in other arrangements, f(VREF) can be generated from VREF. In other arrangements, a voltage GPIO could be divided before comparison with a voltage VREF.

In the conditions of FIG. 2A, a first switch circuit 106 can provide a voltage VDDIO as a first well bias voltage VWELL (1). In such a configuration, a first well voltage can match a high power supply voltage to prevent forwarding biasing of well/source junctions within a first section. At the same time, second switch circuit 108 can provide voltage VDDCORE as a second well bias voltage VWELL(2). In such a configuration, a second well voltage can match a power supply voltage that can prevent forwarding biasing of well/source junctions within a second section. However, voltage VDDCORE can be less than VDDIO.

Figure 2B:
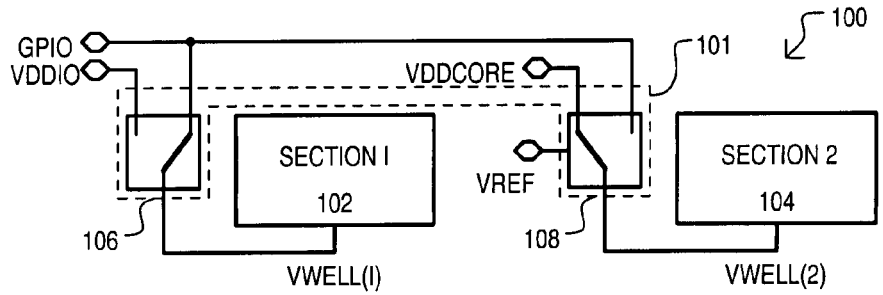

Referring now to FIG. 2B, the operation of an architecture 100 for a second set of voltage conditions is shown. FIG. 2B shows operations of switch circuits (106 and 108) when f(VREF)>GPIO>VDDIO. In such an arrangement, a first switch circuit 106 can provide a voltage GPIO as a first well bias voltage VWELL(1). This can prevent forwarding biasing of well/source junctions within a first section 102 when the high voltage GPIO is input to the section. At the same time, second switch circuit 108 can provide voltage VDDCORE as a second well bias voltage VWELL(2). This is in contrast to conventional approaches that can apply a higher voltage to the wells (e.g., GPIO or VDDIO), thus undesirably increasing the threshold voltages of transistors formed within wells of a section 104.

Figure 2C:
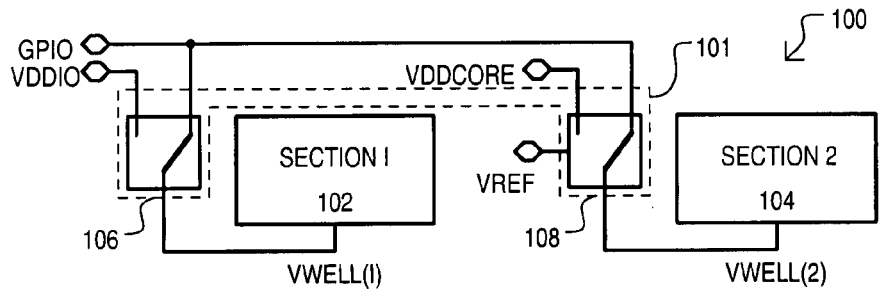

Referring now to FIG. 2C, the operation of an architecture 100 for a third set of voltage conditions is shown. FIG. 2C shows operations of switch circuits (106 and 108) when GPIO>f(VREF)>VDDIO. In such an arrangement, a first switch circuit 106 can provide a voltage GPIO as a first well bias voltage VWELL(1). At the same time, second switch circuit 108 may provide voltage GPIO as a second well bias voltage VWELL(2). Such an arrangement can allow a high voltage to be applied to a second section 104 only when such a voltage is at a particularly high level.

In this way, an architecture 100 can maintain wells in a second section of an integrated circuit at a lower power supply level (VDDCORE), even when a first section has wells biased to a higher potential (GPIO>VDDIO).

Figure 3:
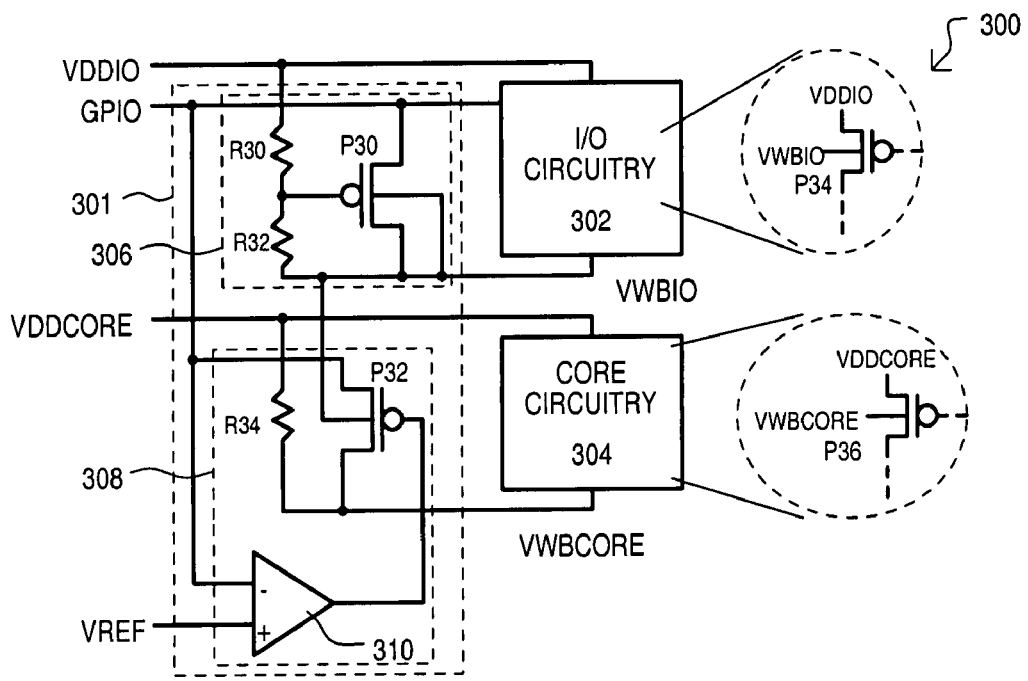
FIG. 3 is a block schematic diagram of a second embodiment.

Referring to FIG. 3, a well bias architecture according to another embodiment is shown in FIG. 3, and designated by the general reference character 300. An architecture 300 can include of the same general sections as that shown in FIG. 1, accordingly, like sections are referred to by the same reference character but with the first digit being a "3" instead of a "1".

The embodiment of FIG. 3 can differ from that of FIG. 1 in that a section 302 is shown to be I/O circuitry of an integrated circuit (IC) device. I/O circuitry 302 can receive inputs from sources external to an IC device, and/or provide output signals from an I/O device. Thus, such circuits can be biased to a higher supply voltage in order to drive output lines or accommodate larger voltage input signals. In the arrangement of FIG. 3, I/O circuitry 302 can include I/O p-channel insulated gate field effect transistors (hereinafter PFETs), one of which is shown as P34. Such PFETs (e.g., P34) can be formed in a well biased to a well voltage VWBIO, and can receive an I/O power supply voltage VDDIO.

FIG. 3 further differs from FIG. 1 in that section 304 is shown to be core circuitry. Core circuitry 304 can operate at a lower supply voltage VDDCORE than I/O circuitry 302. Core circuitry 304 can include logic, and in particular embodiments, nonvolatile circuit elements. In very particular arrangements, core circuitry 304 can include latch circuits that can load a state determined by one or more nonvolatile circuit elements. In the arrangement of FIG. 3, core circuitry 304 can include core PFETs, one of which is shown as P36. Such PFETs (e.g., P36) can be formed in a well biased to a well voltage VWBCORE, and can receive a core power supply voltage VDDCORE.

Referring still to FIG. 3, in architecture 300, a first switching circuit 306 can include a PFET structure P30, a first resistance R30, and a second resistance R32. PFET structure P30 can have a source coupled to receive an input voltage GPIO and a drain and body commonly connected to provide well bias voltage VWBIO to one or more wells within I/O circuitry 302. A gate of PFET structure P30 can be connected to an I/O power supply voltage (VDDIO) by first resistance R30, and to its drain/body by second resistance R32.

A second switching circuit 308 can include a PFET structure P32, a third resistance R34, and a comparator 310. PFET structure P32 can have a source coupled to a receive an input voltage GPIO, a body connected to the drain/body of PFET structure P30 (and hence to a well within I/O circuitry 302), and a drain that provides a well bias voltage VWBCORE. Well bias voltage VWBCORE can bias one or more wells within core circuitry 304. A gate of PFET structure P32 can be connected to an output of comparator 310. Comparator 310 can have a first (−) input connected to receive the input voltage GPIO and a second input (+) connected to receive a reference voltage VREF.

Figure 4A:
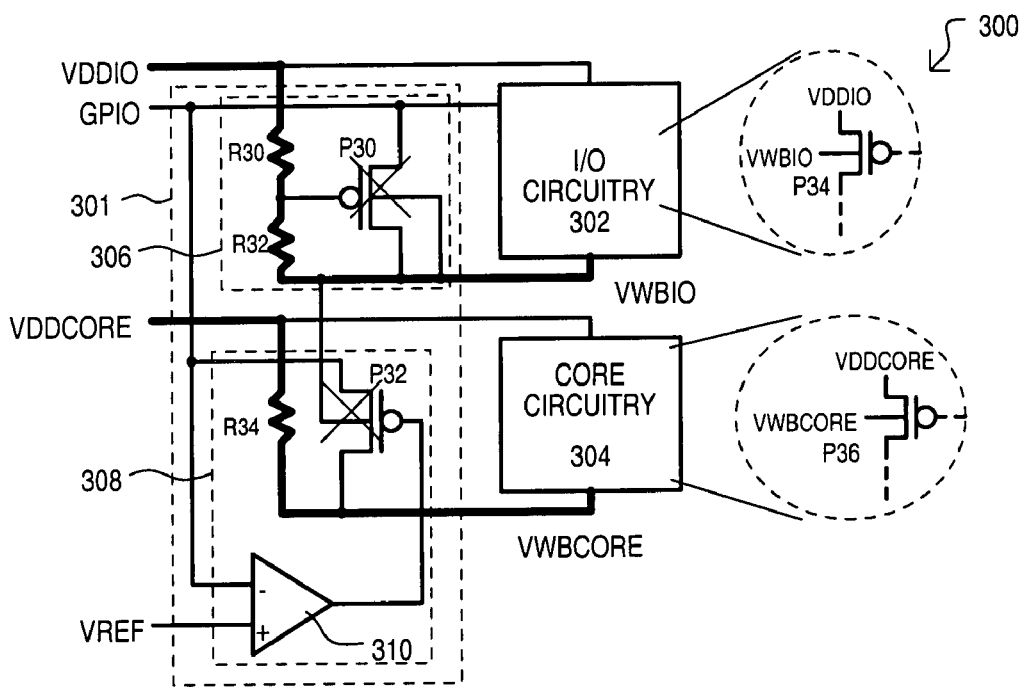
FIGS. 4A to 4C show various operations for the embodiment of FIG. 3.
Figure 4B:
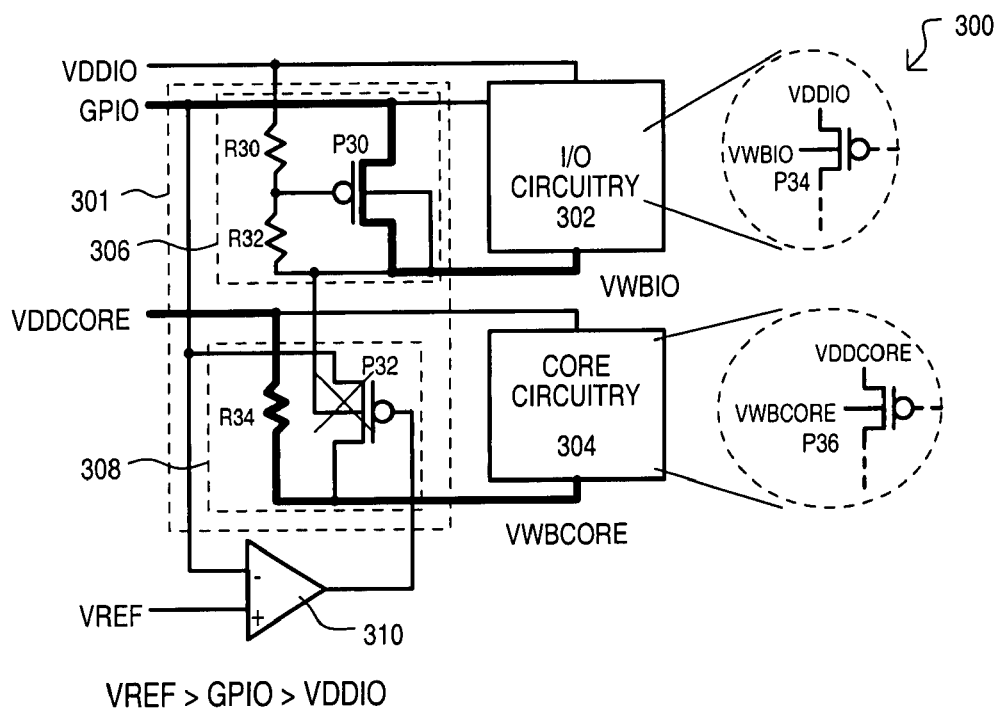
Figure 4C:
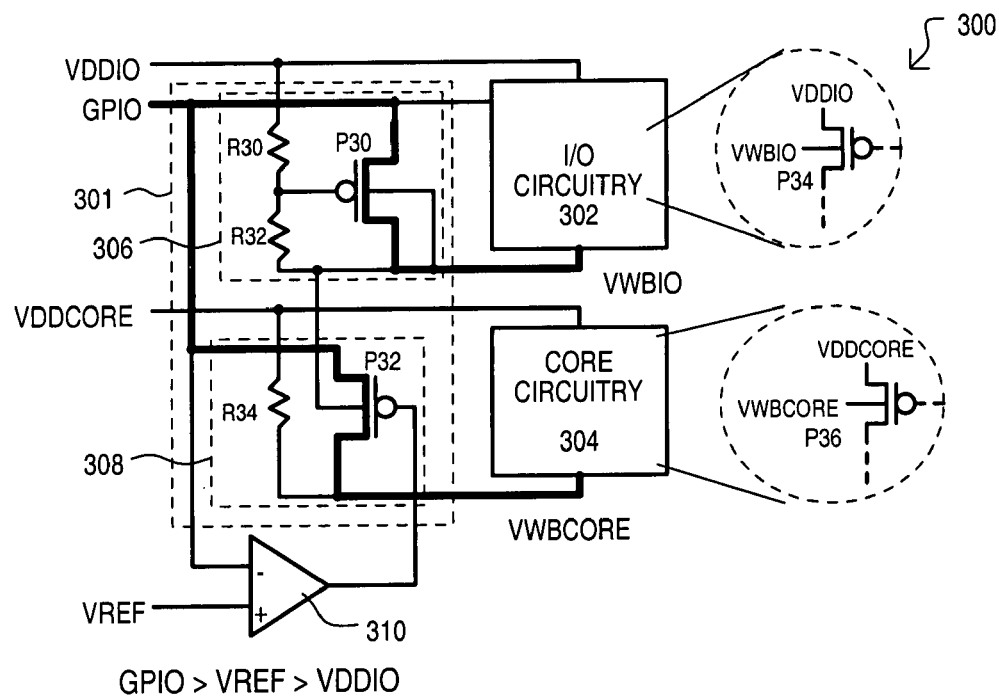

Having described the general construction of the well bias architecture 300 shown in FIG. 3, operations of the architecture will now be described with reference to FIGS. 4A to 4C. FIGS. 4A to 4C show various switching operations dependent upon relative differences between voltages VDDIO, GPIO and VREF.

FIG. 4A shows the operation of architecture 300 under conditions in which voltage GPIO is not significantly greater than voltage VDDIO or VREF. As but one example, FIG. 4A can show an arrangement in which VREF>=VDDIO>=GPIO. In the voltage input arrangement of FIG. 4A, a source-gate voltage (across resistance R30) is not sufficient to turn on PFET structure P30. Consequently, a well bias voltage for I/O circuitry (VWBIO) can follows I/O supply voltage (VDDIO) via resistances R30/R32. This is shown by the bold line path. At the same time, because GPIO is not greater than VREF, comparator 310 can generate a high output that is sufficient to keep a source-drain path of PFET structure P32 in a relatively high impedance state. As a result, a well bias voltage for core circuitry 304 (VWBCORE) can follows a core supply voltage (VDDCORE) via resistance R34. This is also shown by bold lines.

In this way, absent a large input voltage, I/O circuitry 302 can have wells biased to an I/O power supply voltage to enable I/O devices be driven according to such voltage levels, while at the same time, core circuitry 304 can have wells biased to a lower core supply voltage.

FIG. 4B shows the operation of architecture 300 under conditions in which voltage GPIO is significantly greater than voltage VDDIO, but not greater than voltage VREF. As but one example, FIG. 4B can show an arrangement in VREF>GPIO>VDDIO. In this input voltage arrangement, a source-gate voltage of PFET structure P30 is sufficient to place the device into a low impedance state. As a result, a well bias voltage for I/O circuitry 302 (VWBIO) follows the higher voltage GPIO. This is shown by the bold line path. This can prevent PFET devices within I/O circuitry from having forward biased junctions due to the application of an increased GPIO voltage. At the same time, however, PFET structure P32 remains in the relatively high impedance state. Thus, a well bias voltage for core circuitry 304 (VWBCORE) can follow core supply voltage VDDCORE. This is also shown by bold lines.

In this way, when a large input voltage is received at I/O circuitry 302, a well bias for such circuits can be increased to ensure proper operation. However, at the same time, core circuits can continue to receive a lower core power supply voltage, and thus do not have increased threshold voltages, as can occur in conventional approaches like those of FIGS. 8A-8C and 9A-9B. This mode of operation can be useful for supporting inputs from external devices having higher I/O voltages (i.e., 5V, wherein VREF>5V) while still allowing lower core circuitry to operate with nominal Vts.

FIG. 4C shows the operation of architecture 300 under conditions in which voltage GPIO is significantly greater than voltages VDDIO and VREF. As but one example, FIG. 4B can show an arrangement in which GPIO>VREF>VDDIO. In this input voltage arrangement, a source-gate voltage of PFET structure P30 is sufficient to place the device in a low impedance state. At the same time, a source-gate voltage of PFET structure P32 is sufficient to place this device in a low impedance state, as well. As a result, a well bias voltage for both I/O circuitry 302 and core circuitry 304 (VWBIO and VWBCORE) can follow voltage GPIO.

In this way, for a sufficiently large input voltage, wells in both a I/O circuitry 302 and core circuitry 304 can be biased to such a larger input voltage, to thereby prevent leakage current to a core power supply voltage.

It is understood that the structure shown in FIGS. 3 to 4C can automatically switch between states. That is, well biasing is automatic upon changes in the received supply voltages.

The various embodiments above have shown arrangements that receive a voltage GPIO. While some embodiments can include a dedicated input for such a voltage, other embodiments can utilize a shared input to receive such a voltage. That is, a voltage GPIO can be received at an input that serves more than one function for an integrated circuit device. One such arrangement is shown in FIG. 5.

Figure 5:
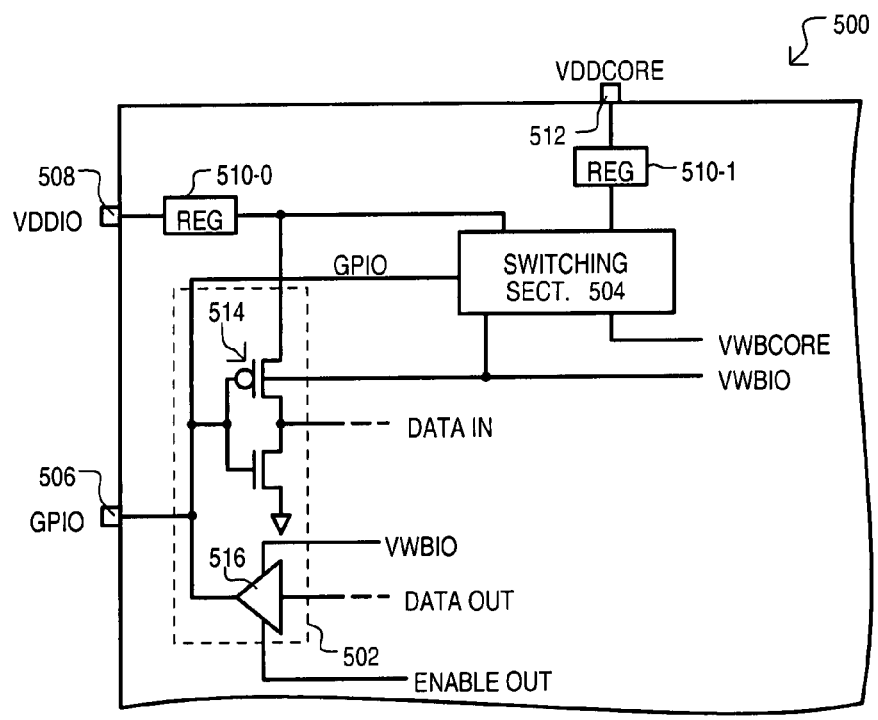
FIG. 5 shows an integrated circuit according to one embodiment.

Referring now to FIG. 5, a portion of an integrated circuit (IC) device is shown in a plan view and designated by the general reference character 500. An IC portion 500 can include an input/output (I/O) section 502, switching circuits 504, a general purpose I/O (GPIO) structure 506, an I/O power supply input 508, and a core power supply input 512. Optionally, voltage regulators 510-0 and 510-1 can be included.

An I/O section 502 can receive an input signal from, or provide an output signal to GPIO structure 506. In the particular example shown, an I/O section 502 can include an input buffer 514. In addition or alternatively, an I/O section can include an output buffer 516. An input buffer 514 can drive input signals received at GPIO structure 506, to provide signals to other portions of an IC. An output buffer 516 can receive signals from other portions of the IC and drive GPIO structure 506 according to such signals. An output buffer 516 can include one or more PFETs formed in an n-well that is biased with well bias voltage VWBIO. Such an arrangement can ensure that junctions within such PFETs do not get forward biased when a higher voltage input (e.g., greater than VDDIO) is received. For embodiments that include both an input buffer 514 and an output buffer 516, an output buffer 516 can be placed in a high impedance state by a signal ENABLE OUT when GPIO structure 506 operates as an input. Switching circuits 504 can be switching circuits that provide a well bias voltage according to any of the architectures described herein, or equivalents. A GPIO structure 506, I/O power supply input 508, or core power supply input 512 can be physical inputs to an IC. For example, such structures can be IC die bond pads or IC package pins. Voltage regulators 110-0 and 110-1 can ensure a received power supply voltage (VDDIO or VDDCORE) is provided at a consistent level.

Referring still to FIG. 5, in a first mode of operation, a GPIO structure 506 can receive a logic signal input that vary between voltages VDDIO and VSS. In addition or alternatively, GPIO structure 506 can provide output signals at such levels. Thus, in a first mode of operation, a GPIO structure 506 can be one of numerous I/Os to an integrated circuit device. Because input signals in such a mode are not greater than VDDIO, switching circuits 504 can bias wells at supply levels (VDDIO or VDDCORE).

In a second mode of operation, a high voltage can be applied at GPIO structure 506. Depending upon the magnitude of the voltage, switching circuit 504 can provide such a signal as a biasing voltage to I/O circuits or both I/O circuits and core circuits.

In this way, a GPIO can be used to provide an input signal tolerant of being driven moderately higher than VDDIO or a high voltage that can bias wells for such events as the programming of nonvolatile storage elements.

Figure 6:
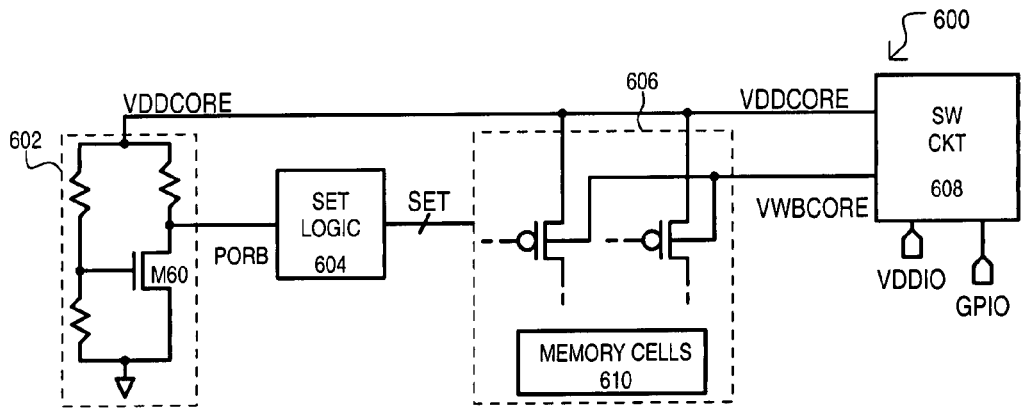
FIG. 6 shows a power-on-reset (POR) circuit according to an embodiment.

Referring now to FIG. 6, a power-on reset (POR) circuit according to an embodiment is shown in block schematic diagram and designated by the general reference character 600. A POR circuit 600 can include a level detect circuit 602, set logic 604, core circuits 606 and switching circuit 608. Level detect circuit 602 can detect when a power supply level (e.g., VDDCORE) is above a predetermined level to generate a PORB signal. Level detect circuit 602 can include a transistor M60. Transistor M0 can be a "native" device that has a threshold voltage dependent upon transistor structure. In the example shown, a transistor M60 can be an n-channel transistor formed in a substrate that is maintained at a constant voltage (e.g., VSS), thus its threshold voltage does not vary substantially.

Set logic 604 can be activated in response to a signal PORB going low, to output predetermined set signals SET that can establish logic states in core circuits 606.

Core circuits 606 can include PFETs formed in a well that can receive a well bias potential VWBCORE, and having drains that receive a core power supply voltage VDDCORE. In the example shown, core circuits can also include memory cells 610. In one arrangement, PFETs of core section 606 can provide access to memory cells, in another arrangement PFETs of core section 606 can form part of such memory cells.

Switching circuits 608 can be switching circuits that provide a well bias voltage according to any of the architectures described herein, or equivalents.

In the arrangement of FIG. 6, in a power-up or reset operation (PORB goes low), core circuits 606 can continue to receive a power supply voltage VDDCORE, even if an input GPIO is greater than VDDIO. Thus, threshold voltages of PFETs in core circuits 606 are not raised by a well bias, as can be the case for conventional architectures that drive a core well with a voltage GPIO or VDDIO. As a result, core circuits 606 can be expected to operate properly, and not require additional headroom to accommodate high Vts.

Figure 7:
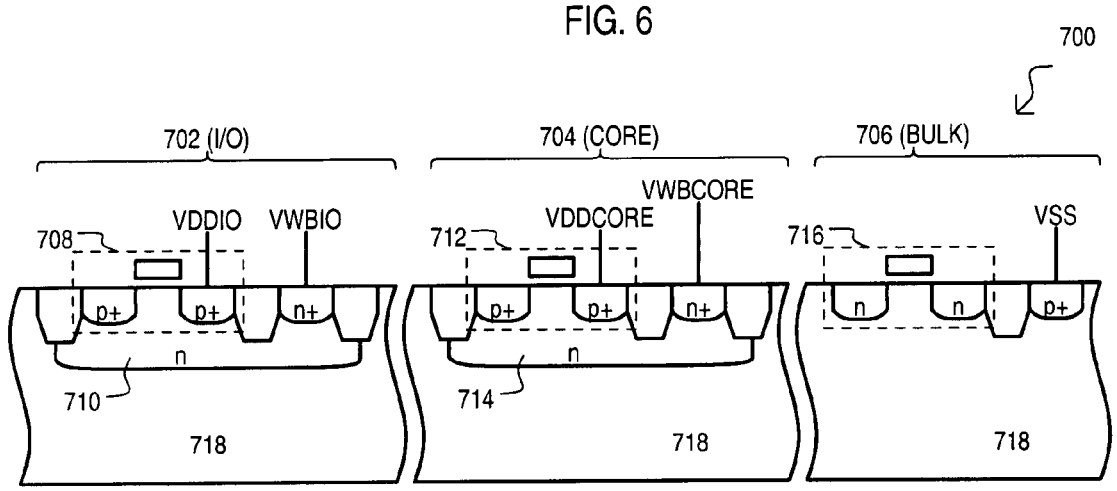
FIG. 7 is a side cross sectional view showing an integrated circuit biasing arrangement according to an embodiment.

Referring now to FIG. 7 an integrated circuit biasing arrangement is shown in a side cross sectional view, designated by the general reference character 700. FIG. 7 shows an I/O section 702, a core section 704, and a bulk section 706. Within an I/O section 702, a PFET 708 can be formed in a first n-well well 710 that is biased to a potential VWBIO. A voltage VWBIO can vary according to the embodiments shown above.

Within a core section 704, a p-channel IGFET 712 can be formed in a second n-well 714 that is biased to a potential VWBCORE. A voltage VWBCORE can vary according to the embodiments shown above.

A bulk section 706 can optionally include a native n-channel IGFET 716 formed in a p-type bulk substrate 718. In the example of FIG. 7, n-wells 710 and 714 can be formed in substrate 718.

Of course FIG. 7 shows but one possible transistor biasing arrangement that can be included in the embodiments.

Advantages of the embodiments include that supply sequencing requirements present in conventional approaches can be dispensed with, and headroom limitations for PFET devices can be reduced or eliminated. Furthermore, substantial leakage paths at a voltage input pin to a lower core voltage can be avoided. In addition, well biasing can be automatically switched to predetermined levels.

As noted above, in an alternative embodiment a dedicated programming pin (not shared with another input) may be used. In addition, one or more well biasing input pin may be provided instead of automatically generating the well bias voltage or voltages. In another alternative embodiment it is possible to change conductivity types to provide variations in low power supply voltages (e.g., negative supply voltage such as a VBB "back bias" voltage).

The invention can be used in devices that utilize relatively large voltages for particular modes, such as programmable logic, programmable clock chips, and other programmable devices where programmable features are included, but a low pin count is desirable. Of course the invention may also be used for other types of devices that include switching between two or more distinct operating voltage levels. For instance, the circuit may be used to switch between a low voltage, low power mode to a higher voltage, higher performance, higher power mode. Such arrangements can include devices having smaller numbers of circuit components, such as standalone switching devices or voltage regulators, or can include more complex arrangements, such as a power subsystem for a microprocessor.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of the improved solution and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects.

What is claimed is:

1. A high voltage switch circuit, comprising:
a first well switch circuit configured to provide a first switch output to a first well that tracks a greater of an input voltage and a first supply voltage;
a voltage comparator configurable to compare the input voltage to a predetermined reference level and generate a comparator output; and
a second well switch circuit configured to provide the input voltage to a second well in response to the comparator output having a first value.

2. The high voltage switch circuit of claim 1, wherein:
the second well switch is further configured to provide a second supply voltage to the second well in response to the comparator output having a second value.

3. The high voltage switch circuit of claim 2, wherein:
the comparator output provides a comparator output of the first value when the input voltage is greater than the reference level, and a comparator output of the second value when the input voltage is less than the reference level.

4. The high voltage switch circuit of claim 1, wherein:
the first well switch circuit includes at least one first switch insulated gate field effect transistor (IGFET) having a source-drain path connected between an input voltage source and the first well.

5. The high voltage switch circuit of claim 4, wherein:
the at least first switch IGFET comprises a p-channel IGFET.

6. The high voltage switch circuit of claim 4, wherein:
the first well switch circuit further includes a first resistance coupled between a first supply voltage source and a gate of the at least first switch IGFET, and a second resistance coupled between the gate of the at least first switch IGFET and the first well.

7. The high voltage switch circuit of claim 1, wherein:
the second well switch circuit includes at least one second switch IGFET having a source-drain path connected between the first well and the second well.

8. The high voltage switch circuit of claim 7, wherein:
the at least second switch IGFET comprises a p-channel IGFET.

9. The high voltage switch circuit of claim 6, wherein:
the second well switch circuit further includes the gate of the at least second switch IGFET being coupled to the comparator output.

10. A well supply switch architecture, comprising:
a first section having a first plurality of transistors formed in at least a first well;
a second section having a second plurality of transistors formed in at least a second well; and
a switch section having a first switch circuit that couples the first well to an input voltage or to a first supply voltage based on a difference between the input voltage and first supply voltage, and a second switch circuit that couples the second well to the input voltage or to a second supply voltage based on a difference between the input voltage and a reference voltage.

11. The well supply switch architecture of claim 10, wherein:
the at least first well comprises an n-well and the first plurality of transistors are p-channel insulated gate field effect transistors (IGFETs); and
the at least second well comprises an n-well and the second plurality of transistors are p-channel IGFETs.

12. The well supply switch architecture of claim 11, wherein:
the first section comprises a section of an integrated circuit (IC) that provides signal paths between the IC and another device; and
the second section comprises a core section of an integrated circuit that includes memory cells.

13. The well supply switch architecture of claim 10, wherein:
the input voltage is received at a input that provides a logic signal path to an integrated circuit in a first mode, and a power supply voltage to the integrated circuit in a second mode.

14. The well supply switch architecture of claim 10, wherein:
the first switch circuit includes a first switch transistor having a source-drain path connected between the input voltage and the first well, and the second switch circuit includes a second switch transistor having a source-drain path connected between the input voltage and the second well and a comparator circuit having a first input coupled to the input voltage, a second input coupled to the reference voltage, and an output coupled to the gate of the second switch transistor.

15. The well supply switch architecture of claim 14, wherein:
the first switch circuit further includes a first resistance coupled between the first supply voltage and the gate of the first switch circuit and a second resistance coupled between the gate of the first switch circuit and the first well.

16. The well supply switch architecture of claim 14, wherein:
the first switch transistor and the second switch transistor have bodies commonly connected to the first well.

17. A method of providing well biasing voltages to different wells of an integrated circuit, comprising the steps of:
if an input voltage is no greater than a first supply voltage and a reference level, coupling a first well to the first supply voltage and a second well to a second supply voltage;
if the input voltage is greater than a first supply voltage and no greater than the reference level, coupling the first well to the input voltage and the second well to the second supply voltage; and
if the input voltage is greater than the first supply voltage and the reference level, coupling the first well and second well to the input voltage.

18. The method of claim 17, wherein:
coupling the first well to the first supply voltage and the second well to the second supply voltage includes
placing a first switch transistor having a source-drain path between the input voltage and the first well into a high impedance state,
providing a first voltage path between the first supply voltage and the first well,
placing a second switch transistor having a source-drain path between the input voltage and the second well into a high impedance state, and
providing a second voltage path between the second supply voltage and the second well.

19. The method of claim 17, wherein:
coupling the first well to the input voltage and the second well to the second supply voltage includes
placing a first switch transistor having a source-drain path between the input voltage and the first well into a low impedance state,
placing a second switch transistor having a source-drain path between the input voltage and the second well into a high impedance state, and
providing a second voltage path between the second supply voltage and the second well.

20. The method of claim 17, wherein:
coupling the first well and second well to the input voltage includes
placing a first switch transistor having a source-drain path between the input voltage and the first well into a low impedance state, and
placing a second switch transistor having a source-drain path between the input voltage and the second well into a low impedance state.

* * * * *